(12) United States Patent
Hubbard et al.

(10) Patent No.: US 9,119,330 B2
(45) Date of Patent: Aug. 25, 2015

(54) SYSTEM FOR COOLING AN ELECTRONIC IMAGE ASSEMBLY WITH A HEAT EXCHANGER HAVING INTERNAL FANS

(71) Applicant: Manufacturing Resources International, Inc., Alpharetta, GA (US)

(72) Inventors: Tim Hubbard, Alpharetta, GA (US); William Dunn, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 5 days.

(21) Appl. No.: 14/475,173

(22) Filed: Sep. 2, 2014

(65) Prior Publication Data

US 2014/0369003 A1    Dec. 18, 2014

Related U.S. Application Data

(63) Continuation of application No. 13/100,580, filed on May 4, 2011, now Pat. No. 8,823,916, and a continuation-in-part of application No. 12/905,704, filed on Oct. 15, 2010, now Pat. No. 8,773,633, said (Continued)

(51) Int. Cl.
| | |
|---|---|
| *G02F 1/1333* | (2006.01) |
| *H05K 7/20* | (2006.01) |
| *F28D 15/00* | (2006.01) |
| *G02F 1/1335* | (2006.01) |

(52) U.S. Cl.
CPC ...... *H05K 7/20972* (2013.01); *G02F 1/133308* (2013.01); *H05K 7/20145* (2013.01); *G02F 1/133382* (2013.01); *G02F 1/133385* (2013.01); *G02F 2001/13332* (2013.01); *G02F 2001/133628* (2013.01); *G02F 2201/36* (2013.01); *H05K 2007/20027* (2013.01)

(58) Field of Classification Search
CPC ........... H05K 7/20972; H05K 7/20145; G02F 1/133308
USPC .................... 349/58, 161; 361/692, 694–696; 165/104.34, 121
See application file for complete search history.

(56) References Cited

U.S. PATENT DOCUMENTS

| | | | |
|---|---|---|---|
| 5,869,919 A | 2/1999 | Sato | |
| 5,991,153 A * | 11/1999 | Heady et al. | 361/704 |
| 6,428,198 B1 | 8/2002 | Saccomanno | |
| 6,493,440 B2 * | 12/2002 | Gromatzky et al. | 379/161 |
| 7,059,757 B2 | 6/2006 | Shimizu | |

(Continued)

FOREIGN PATENT DOCUMENTS

| | | |
|---|---|---|
| GB | 2402205 | 1/2004 |
| JP | 2008292743 | 12/2008 |

(Continued)

*Primary Examiner* — Jerry Blevins
(74) *Attorney, Agent, or Firm* — Standley Law Group LLP

(57) ABSTRACT

A system for cooling an electronic image assembly using a heat exchanger with an internal fan assembly. Circulating gas may also be used to cool a front portion of the electronic image assembly or any other internal cavity of the electronic display housing. The circulating gas may be drawn through a heat exchanger so that heat may be transferred to an ambient gas. The heat exchanger may have an internal fan assembly for drawing ambient air through the heat exchanger and exhausting it out of the display housing. The heat exchanger may be divided into two portions so that the fan assembly is placed between the two portions.

20 Claims, 9 Drawing Sheets

Related U.S. Application Data application No. 13/100,580 is a continuation-in-part of application No. 12/641,468, filed on Dec. 18, 2009, now Pat. No. 8,654,302, said application No. 13/100,580 is a continuation-in-part of application No. 12/556,029, filed on Sep. 9, 2009, now Pat. No. 8,373,841, said application No. 13/100,580 is a continuation-in-part of application No. 12/234,307, filed on Sep. 19, 2008, now Pat. No. 8,767,165, said application No. 13/100,580 is a continuation-in-part of application No. 12/234,360, filed on Sep. 19, 2008, said application No. 13/100,580 is a continuation-in-part of application No. 12/237,365, filed on Sep. 24, 2008, now Pat. No. 8,879,042, said application No. 13/100,580 is a continuation-in-part of application No. 12/235,200, filed on Sep. 22, 2008, said application No. 13/100,580 is a continuation-in-part of application No. 12/620,330, filed on Nov. 17, 2009, now Pat. No. 8,274,622, said application No. 13/100,580 is a continuation-in-part of application No. 12/706,652, filed on Feb. 16, 2010, now Pat. No. 8,358,397, said application No. 13/100,580 is a continuation-in-part of application No. 12/753,298, filed on Apr. 2, 2010, now Pat. No. 8,351,014.

(60) Provisional application No. 61/331,340, filed on May 4, 2010, provisional application No. 61/252,295, filed on Oct. 16, 2009, provisional application No. 61/138,736, filed on Dec. 18, 2008, provisional application No. 61/095,615, filed on Sep. 9, 2008, provisional application No. 61/033,064, filed on Mar. 3, 2008, provisional application No. 61/053,713, filed on May 16, 2008, provisional application No. 61/057,599, filed on May 30, 2008, provisional application No. 61/076,126, filed on Jun. 26, 2008, provisional application No. 61/115,333, filed on Nov. 17, 2008, provisional application No. 61/152,879, filed on Feb. 16, 2009.

(56) References Cited

U.S. PATENT DOCUMENTS

| | | | |
|---|---|---|---|
| 7,083,285 | B2 | 8/2006 | Hsu |
| 7,284,874 | B2 | 10/2007 | Jeong et al. |
| 2005/0213950 | A1 | 9/2005 | Yoshimura |
| 2006/0012985 | A1* | 1/2006 | Archie et al. ............ 362/227 |
| 2006/0132699 | A1 | 6/2006 | Cho |
| 2006/0199514 | A1 | 9/2006 | Kimura |
| 2006/0209266 | A1 | 9/2006 | Utsunomiya |
| 2006/0283579 | A1* | 12/2006 | Ghosh et al. ............ 165/104.33 |
| 2007/0140671 | A1 | 6/2007 | Yoshimura |
| 2007/0151664 | A1 | 7/2007 | Shin |
| 2009/0154096 | A1 | 6/2009 | Iyengar |

FOREIGN PATENT DOCUMENTS

| | | |
|---|---|---|
| KR | 20060016469 | 2/2006 |
| KR | 100666961 | 1/2007 |
| WO | WO2005079129 | 8/2005 |

* cited by examiner

SYSTEM FOR COOLING AN ELECTRONIC IMAGE ASSEMBLY WITH A HEAT EXCHANGER HAVING INTERNAL FANS

CROSS-REFERENCE TO RELATED APPLICATIONS

This application is a continuation of U.S. application Ser. No. 13/100,580 filed on May 4, 2011, now U.S. Pat. No. 8,823,916, issued Sep. 2, 2014, which is a non-provisional application of U.S. Provisional Application No. 61/331,340, filed May 4, 2010. U.S. application Ser. No. 13/100,580 is also a continuation-in-part of U.S. application Ser. No. 12/905,704 filed Oct. 15, 2010, now U.S. Pat. No. 8,773,633, issued Jul. 8, 2014, which is a non-provisional application of U.S. Provisional Application No. 61/252,295 filed Oct. 16, 2009. U.S. application Ser. No. 13/100,580 is also a continuation-in-part of U.S. application Ser. No. 12/641,468 filed Dec. 18, 2009, now U.S. Pat. No. 8,654,302, issued Feb. 18, 2014, which is a non-provisional of U.S. Application No. 61/138,736 filed Dec. 18, 2008. U.S. application Ser. No. 13/100,580 is also a continuation-in-part of U.S. application Ser. No. 12/556,029 filed Sep. 9, 2009, now U.S. Pat. No. 8,373,841, issued Feb. 12, 2013, which is a non-provisional application of U.S. provisional application No. 61/095,615 filed Sep. 9, 2008. U.S. application Ser. No. 13/100,580 is also a continuation-in-part of U.S. application Ser. No. 12/234,307 filed Sep. 19, 2008, now U.S. Pat. No. 8,767,165, issued Jul. 1, 2014, which is a non-provisional application of U.S. Application No. 61/033,064 filed Mar. 3, 2008. U.S. application Ser. No. 13/100,580 is also a continuation-in-part of U.S. application Ser. No. 12/234,360 filed Sep. 19, 2008, which is a non-provisional application of U.S. Application No. 61/053,713 filed May 16, 2008. U.S. application Ser. No. 13/100,580 is also a continuation-in-part of U.S. application Ser. No. 12/237,365 filed Sep. 24, 2008, which is a non-provisional application of U.S. Application No. 61/057,599 filed May 30, 2008. U.S. application Ser. No. 13/100,580 is also a continuation-in-part of U.S. application Ser. No. 12/235,200 filed Sep. 22, 2008, which is a non-provisional of U.S. Application No. 61/076,126 filed Jun. 26, 2008. U.S. application Ser. No. 13/100,580 is also a continuation-in-part of U.S. application Ser. No. 12/620,330 filed Nov. 17, 2009, now U.S. Pat. No. 8,274,622, issued Sep. 25, 2012, which is a non-provisional of U.S. Application No. 61/115,333 filed Nov. 17, 2008. U.S. application Ser. No. 13/100,580 is also a continuation-in-part of U.S. application Ser. No. 12/706,652 filed Feb. 16, 2010, now U.S. Pat. No. 8,358,397, issued Jan. 22, 2013, which is a non-provisional application of U.S. provisional application 61/152,879 filed Feb. 16, 2009. U.S. application Ser. No. 13/100,580 is also a continuation-in-part of U.S. application Ser. No. 12/753,298 filed Apr. 2, 2010, now U.S. Pat. No. 8,351,014, issued Jan. 8, 2013. All aforementioned applications are hereby incorporated by reference in their entirety as if fully cited herein.

TECHNICAL FIELD

Exemplary embodiments generally relate to cooling systems and in particular to cooling systems for electronic displays.

BACKGROUND OF THE ART

Improvements to electronic displays now allow them to be used in outdoor environments for informational, advertising, or entertainment purposes. While displays of the past were primarily designed for operation near room temperature, it is now desirable to have displays which are capable of withstanding large surrounding environmental temperature variations. For example, some displays are capable of operating at temperatures as low as −22F and as high as 113 F or higher. When surrounding temperatures rise, the cooling of the internal display components can become even more difficult.

Additionally, modern displays have become extremely bright, with some backlights producing 1,000-2,000 nits or more. Sometimes, these illumination levels are necessary because the display is being used outdoors, or in other relatively bright areas where the display illumination must compete with other ambient light. In order to produce this level of brightness, illumination devices and electronic displays may produce a relatively large amount of heat.

Still further, in some situations radiative heat transfer from the sun through a front display surface can also become a source of heat. In some locations 800-1400 Watts/m$^2$ or more through such a front display surface is common. Furthermore, the market is demanding larger screen sizes for displays. With increased electronic display screen size and corresponding front display surfaces, more heat will be generated and more heat will be transmitted into the displays.

Exemplary modern displays have found some effective means for cooling the displays including circulating a closed loop of gas around the display and drawing ambient gas through the display so that the closed loop of gas may be cooled (as well as portions of the electronic display). Various thermal communications have been discovered which can transfer heat away from the sensitive electronic components and out of the display. Heat exchangers were found to produce an excellent means for transferring heat between the closed loop of gas and the ambient gas. However, previous designs for moving the gas through the display have been found to generate an undesirable amount of noise emission from the display as well as thermal gradients where portions of the display were cooled but others remained warm.

When using LCD displays, it was found that backlights were often a source of heat and it was desirable to move gas across the rear surface of the backlight in order to cool it. While desirable, it was thought that the front surface of the backlight could not be cooled for fear that the backlight cavity would become contaminated with dust, dirt, or other particulate.

SUMMARY OF THE EXEMPLARY EMBODIMENTS

Exemplary embodiments use a combination of circulating gas and ambient gas in order to adequately cool an electronic display. Circulating gas may be used to remove heat from the front of the image assembly. When using a LCD as the electronic image assembly, circulating gas may also be used to remove heat from the backlight cavity of the LCD. Because the gas is only circulating within the display, it can remain free of particulate and contaminates and will not harm the display.

Ambient gas may be ingested into the display in order to cool the circulating gas. The ambient gas and the circulating gas may be drawn through a heat exchanger which will allow the heat to transfer from the circulating gas to the ambient gas, preferably without letting the ambient and circulating gases mix with one another. An exemplary embodiment would use a cross-flow heat exchanger. An additional flow of ambient gas can be drawn across the rear surface of the image assembly to remove heat from the rear portion of the image assembly. When using a LCD as the electronic image assembly, this additional flow of ambient gas can be used to remove heat from the rear portion of the backlight for the LCD.

In order to reduce noise emissions, the fans which drive the ambient and/or circulating gas through the heat exchanger may be placed within the heat exchanger, which can then act as a muffler and reduce the noise emitted by the fans. Further, if using the additional ambient gas pathway behind the image assembly, a manifold may be used to collect the ambient gas along an edge of the display and distribute this into a number of smaller flows. The fans for driving this additional ambient gas pathway can be placed within the manifold in order to reduce the noise emitted by the fans and provide an even distribution of ambient gas across the display.

It has been found that ingesting ambient gas from the top or bottom edge of the display is preferable as these edges are not typically observable to the viewer. However, when ingesting ambient gas from the top or bottom of a portrait-oriented display, it has been found that as the cool ambient gas travels across the rear portion of the electronic image assembly and accepts heat it increases in temperature. Once the cooling air reaches the opposite edge (either top or bottom), it may have increased in temperature substantially and may no longer provide adequate cooling to the opposing portion of the display. Thus, the manifolds herein allow for cool ambient air to adequately cool the entire electronic image assembly in an even manner and reduce any 'hot spots' within the electronic image assembly.

The foregoing and other features and advantages will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Figure 1A:
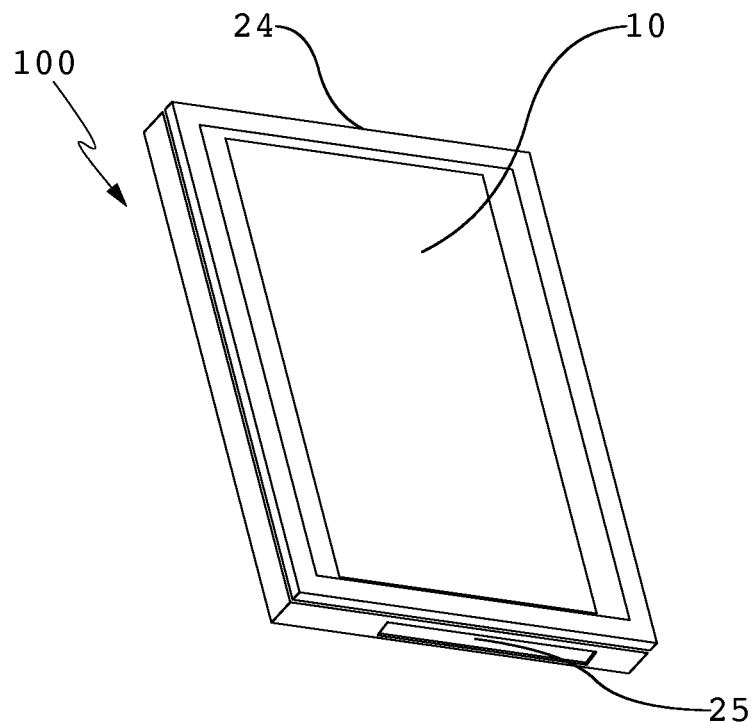
FIG. 1A provides a front perspective view of an exemplary embodiment of the electronic display.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A provides a front perspective view of an exemplary embodiment of the electronic display 100. A transparent front plate 10 is placed on the front portion of the display to protect the internal components and allow the images produced by the display 100 to be seen. Some embodiments may use glass as the transparent front plate 10. Exemplary embodiments may use two pieces of glass laminated with index-matching optical adhesive. Some front plates 10 may provide other utility such as anti-reflection or polarizing functions. An inlet aperture 24 and exit aperture 25 may be provided in the housing so that the display 100 can accept ambient gas for cooling the display 100.

Figure 1B:
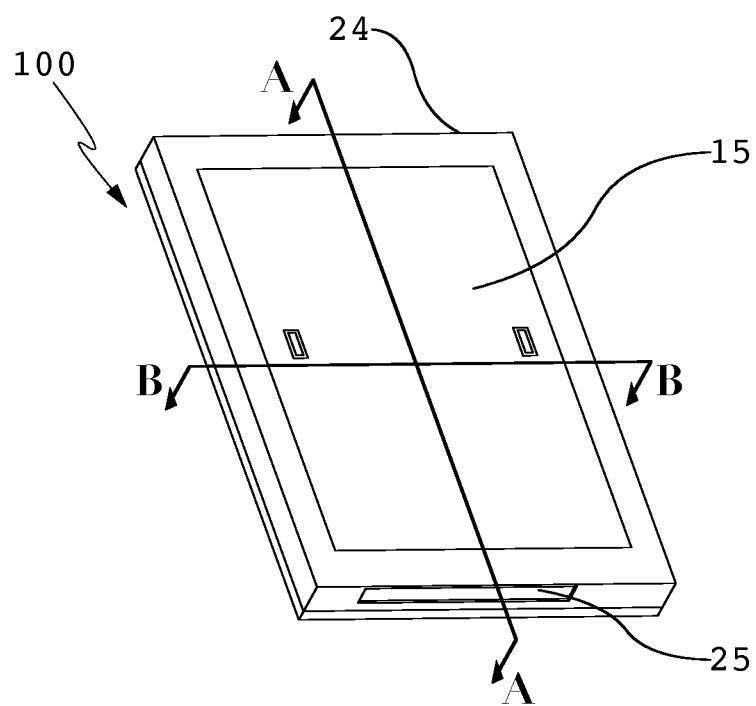
FIG. 1B provides a rear perspective view of an exemplary embodiment of the electronic display.

FIG. 1B provides a rear perspective view of an exemplary embodiment of the electronic display 100. A rear cover 15 may be used to provide access to the internal components of the display 100.

Figure 2:
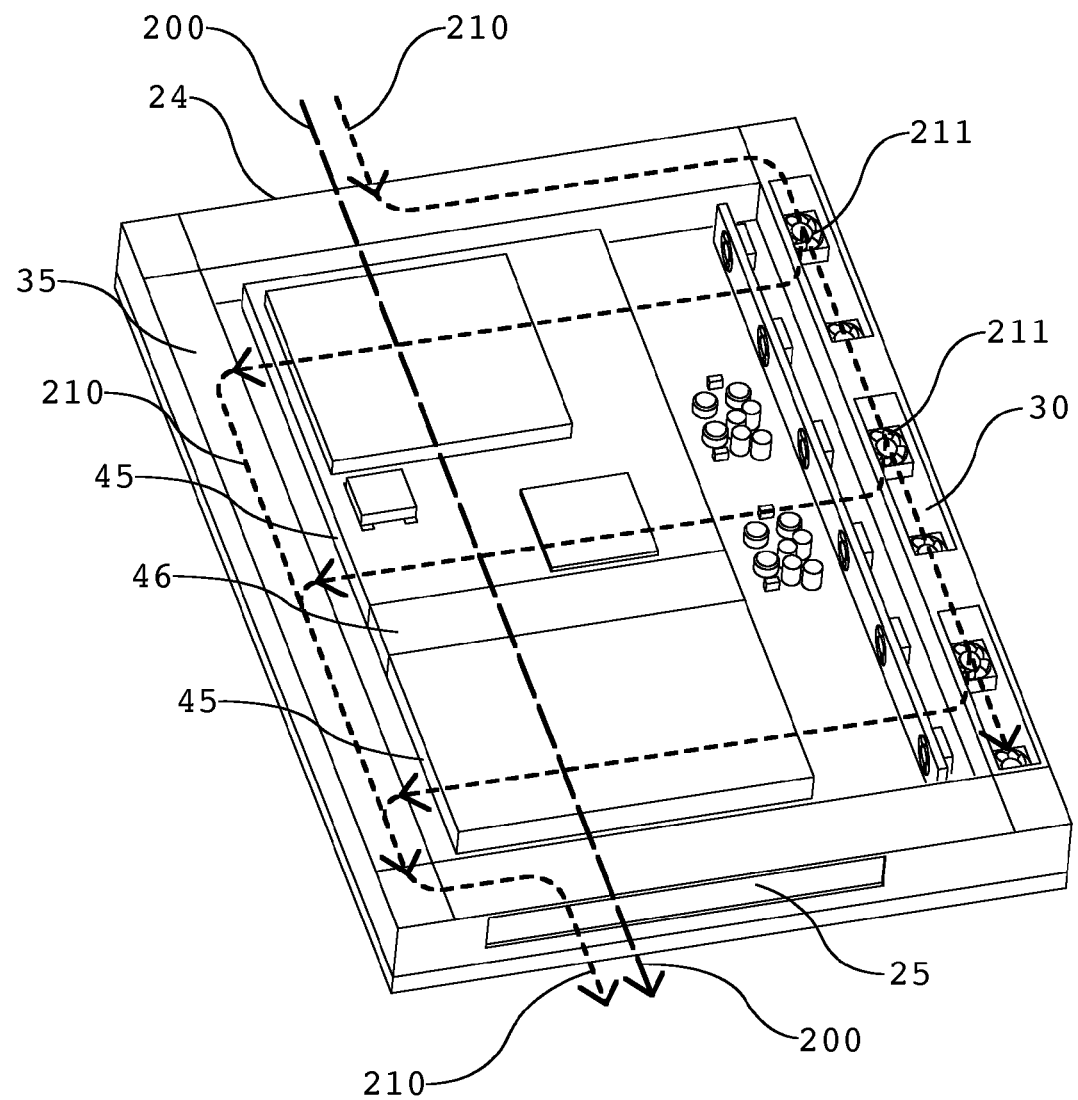
FIG. 2 provides a rear perspective view similar to that shown in FIG. 1B where the rear cover has been removed.

FIG. 2 provides a rear perspective view similar to that shown in FIG. 1B where the rear cover 15 has been removed. Ambient gas 200 may be ingested into the display through the inlet aperture 24 and pass through a heat exchanger 45 and exit the display through the exit aperture 25. The ambient gas 200 may be drawn into the display and forced through the heat exchanger 45 using heat exchanger fan assembly 46. An exemplary placement for the heat exchanger fan assembly 46 is discussed further below, but in many embodiments the fan assembly 46 can be placed near the inlet aperture 24 and/or exit aperture 25 and may or may not be placed within the heat exchanger 45 (as shown in FIG. 2).

Optionally, ambient gas 210 may also be ingested into the display through inlet aperture 24 (or a separate inlet aperture). Ambient gas 210 may then be directed through a first manifold 30 which travels along the edge of the display. The first manifold 30 accepts the single larger inlet flow of ambient gas 210 and distributes it into a plurality of smaller flows (channels 60) across the display. A second manifold 35 may be placed along the opposite edge of the display as the first manifold 30. The second manifold 35 accepts the plurality of smaller flows (channels 60) and combines them into a single flow and exhausts it out of the exit aperture 25 (or a separate exit aperture). In this embodiment, a manifold fan assembly 211 is used to draw the ambient gas 210 into the inlet aperture 24 and force the ambient gas 210 across the display. For this particular embodiment, the manifold fan assembly 211 is placed within the first manifold 30 and is used to draw the ambient gas 210 into the display as well as distribute the single flow into a plurality of smaller flows (channels 60). This is not required however, as some embodiments may place the manifold fan assembly 211 in the second manifold 35, or within both the first and second manifolds 30 and 35.

The first and second manifolds 30 and 35 may be placed along any opposing edges of the display. However, it is preferable that the first and second manifolds 30 and 35 are placed along the vertical edges of the display with the channels 60 travelling horizontally. Other embodiments may place the first and second manifolds 30 and 35 along the horizontal edges of the display with the channels 60 travelling vertically.

While both flows of ambient gas may be used in an exemplary embodiment, there is no requirement that they are both used. Some embodiments may use only ambient gas 200 or ambient gas 210. Also, if using both flows of ambient gas 200 and ambient gas 210 there is no requirement that they share the same inlet and exit apertures. Thus, there may be separate inlet and exit apertures for the two flows of ambient gas.

Figure 3:
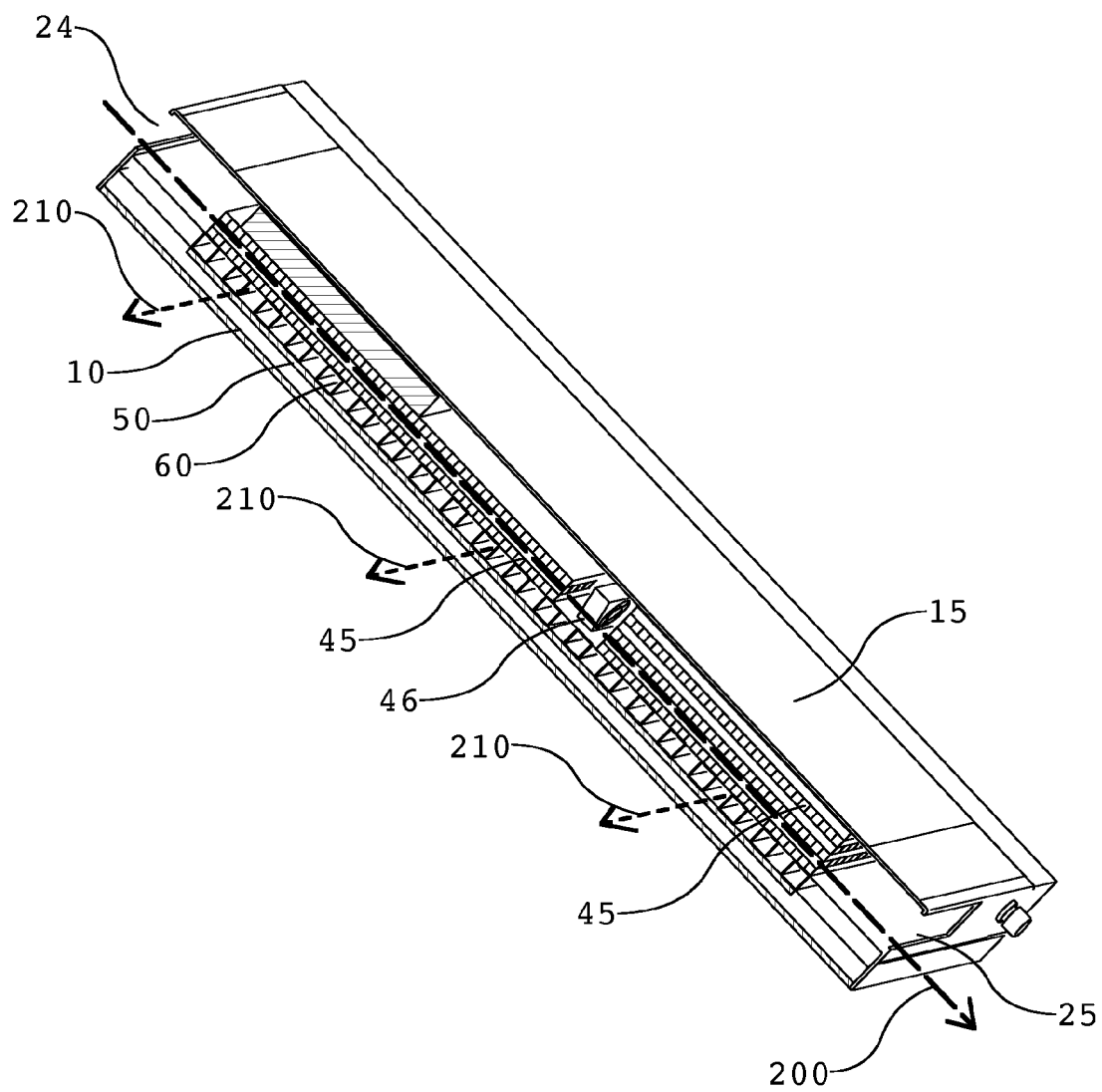
FIG. 3 provides a perspective sectional view along the A-A section line shown in FIG. 1B.

FIG. 3 provides a perspective sectional view along the A-A section line shown in FIG. 1B. Again, ambient gas 200 may be ingested into the display through the inlet aperture 24 and pass through a heat exchanger 45 and exit the display through the exit aperture 25. The ambient gas 200 may be drawn into the display and forced through the heat exchanger 45 using heat exchanger fan assembly 46. Obviously, the inlet aperture 24 may contain a filter or other coverings so that contaminates, insects, garbage, and/or water/fluids cannot easily be ingested into the display. However, an exemplary embodiment would not be damaged if the ambient gas 200 contained contaminates as they would only pass through the heat exchanger 45 which may not be susceptible to damage from particulate or contaminates. Exit aperture 25 may also contain some type of covering to ensure that contaminates and/or insects could not enter the display.

An electronic image assembly 50 may be placed behind the front plate 10. A plurality of channels 60 may be placed behind the electronic image assembly 50. Ambient gas 210 may be forced through the channels 60 after travelling through the first manifold 30 (not shown here). The flow of ambient gas 210 behind the electronic image assembly 50 may be used to remove any buildup of heat from the rear portion of the electronic image assembly 50. It may be preferable to have a thermally conductive surface/plate on the rear portion of the electronic image assembly 50 so that heat can easily transfer to this surface/plate and be removed by the ambient gas 210.

The channels 60 can take on any number of forms. Although shown in this embodiment with a square cross-section this is not required. Other embodiments may contain channels 60 with I-beam cross-sections, hollow square cross-sections, hollow rectangular cross-section, solid rectangular or solid square cross-sections, 'T' cross-sections, 'Z' cross-sections, a honeycomb cross-section, or any combination or mixture of these. The channels 60 are preferably thermally conductive and also preferably in thermal communication with the electronic image assembly 50. Thus, in a preferred embodiment, heat which accumulates on the rear portion of the electronic image assembly 50 may be transferred throughout the channels 60 and removed by ambient gas 210. Preferably, the channels 60 are metallic and even more preferably aluminum. Further, in an exemplary embodiment the channels 60 are in conductive thermal communication with the electronic image assembly 50.

Figure 4:
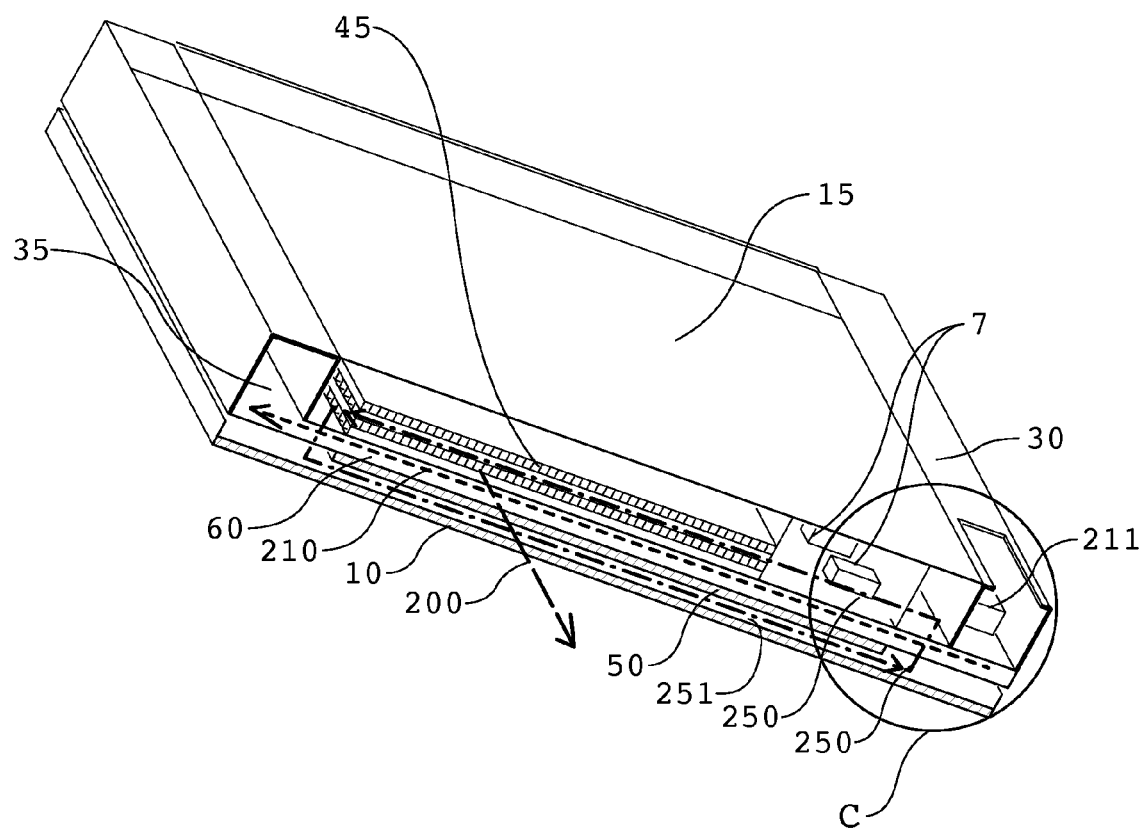
FIG. 4 provides a perspective sectional view along the B-B section line shown in FIG. 1B.

FIG. 4 provides a perspective sectional view along the B-B section line shown in FIG. 1B. In this view, the path of the circulating gas 250 can also be observed. The space between the front plate 10 and the electronic image assembly 50 may define a front channel 251, through which the circulating gas 250 may travel in order to remove any accumulation of heat on the front surface of the electronic image assembly 50. The circulating gas 250 is preferably then directed into the heat exchanger 45 where heat may be transferred from the circulating gas 250 to the ambient gas 200. Upon exiting the heat exchanger 45, the circulating gas 250 may be re-directed into the front channel 251. In this way, the heat exchanger 45 and the front channel 251 are placed in gaseous communication with each other.

The circulating gas 250 may also be directed over various electronic components 7 so that heat may be transferred from the electronic components 7 to the circulating gas 250. The electronic components 7 could be any one of the following but not limited to: power modules, heat sinks, capacitors, motors, microprocessors, hard drives, AC/DC converters, transformers, or printed circuit boards.

Also shown in this sectional view is the path of the ambient gas 210 travelling down one of the channels 60 behind the electronic image assembly 50. In this embodiment, the ambient gas 210 is forced out of the first manifold 30, across the channels 60, and into the second manifold 35 by manifold fan assembly 211. In other words, each channel 60 preferably has an inlet which is in gaseous communication with the first manifold 30 as well as an exit which is in gaseous communication with the second manifold 35. As shown in this Figure, the paths of the ambient gas 210 and the circulating gas 250 may cross, but it is preferable to keep the two gases from mixing (as the ambient gas 210 may contain particulate or contaminates while the circulating gas 250 can remain substantially free of particulate and contaminates). It may be preferable to keep the circulating gas 250 from having particulate or contaminates because it travels in front of the electronic image assembly 50. Thus, to keep the image quality from being impaired, it may be desirable to keep the circulating gas 250 clean and prevent it from mixing with the ambient gas 210.

Figure 5:
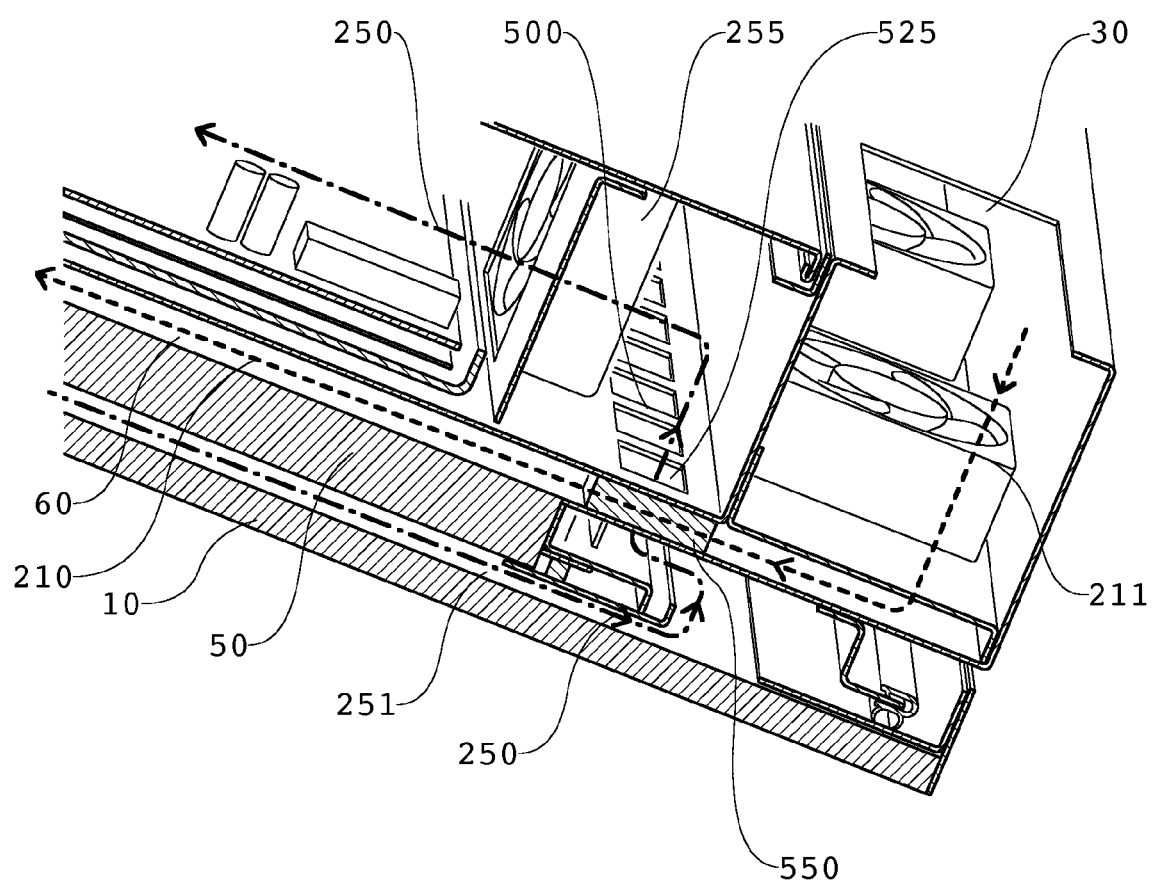
FIG. 5 provides a perspective sectional view of insert C shown in FIG. 4.

FIG. 5 provides a perspective sectional view of insert C shown in FIG. 4. As noted above, if practicing an embodiment which uses ambient gas 210 as well as the circulating gas 250, the pathways of the two gases may need to cross over one another and it may be desirable to prohibit them from mixing to prevent contamination of sensitive portions of the display. Here, cross through plate 500 allows the pathways of the two gases to cross over one another without letting them mix together. The cross through plate 500 in this embodiment contains a series of voids which pass through the plate. A first series of voids 550 passes through the cross through plate 500 and allows ambient gas 210 to travel from the first manifold 30 into the channels 60 which run behind the electronic image assembly 50. A second series of voids 525 pass through the cross through plate 500 in a direction substantially perpendicular to that of the first series of voids 550. The second series of voids 525 allows the circulating gas to exit the front channel 251, cross over the ambient gas 210, and continue towards the heat exchanger 45. In this embodiment, a circulating gas fan assembly 255 is used to draw the circulating gas 250 through the front channel 251 and through the heat exchanger 45. Much like the other fan assemblies shown and described here, the circulating gas fan assembly 255 could be placed anywhere within the display, including but not limited to the entrance/exit of the heat exchanger 45 or the entrance/exit of the front channel 251.

Figure 6:
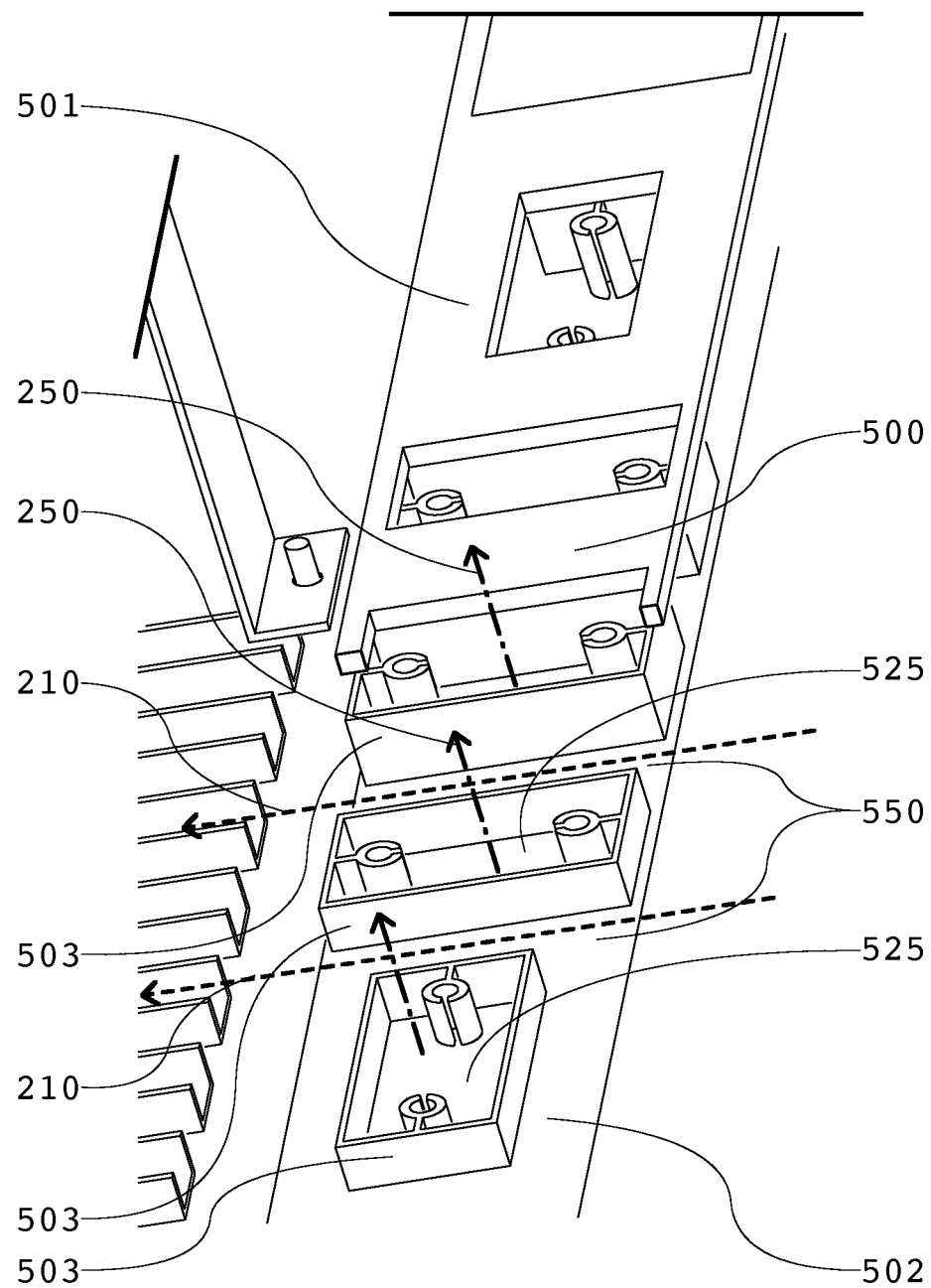
FIG. 6 provides a perspective sectional view of one embodiment of the cross through plate.

FIG. 6 provides a perspective sectional view of one embodiment of the cross through plate 500. In this embodiment, the cross through plate 500 is comprised of a plurality of hollow blocks 503 sandwiched between a top plate 501 and bottom plate 502 with sections of the plates 501 and 502 removed to correspond with the hollow sections of the blocks 503. A portion of the top plate 501 has been removed to show the detail of the hollow blocks 503, first series of voids 550, and second series of voids 525. The cross through plate 500 could take on any number of forms and could be constructed in a number of ways. Some other embodiments may use a solid plate where the first and second series of voids 550 and 525 are cut out of the solid plate. Other embodiments could use two sets of hollow blocks where the hollow sections are perpendicular to each other and the blocks are fastened together. Still other embodiments could use a design similar to those that are taught below for the heat exchanger 45, for example any type of cross-flow heat exchanger design could be used. Thus, an exemplary cross through plate 500 contains two gaseous pathways where the two pathways do not allow the gaseous matter to mix. Here, the first gas pathway would be 525 while the second gas pathway would be 550.

Figure 7:
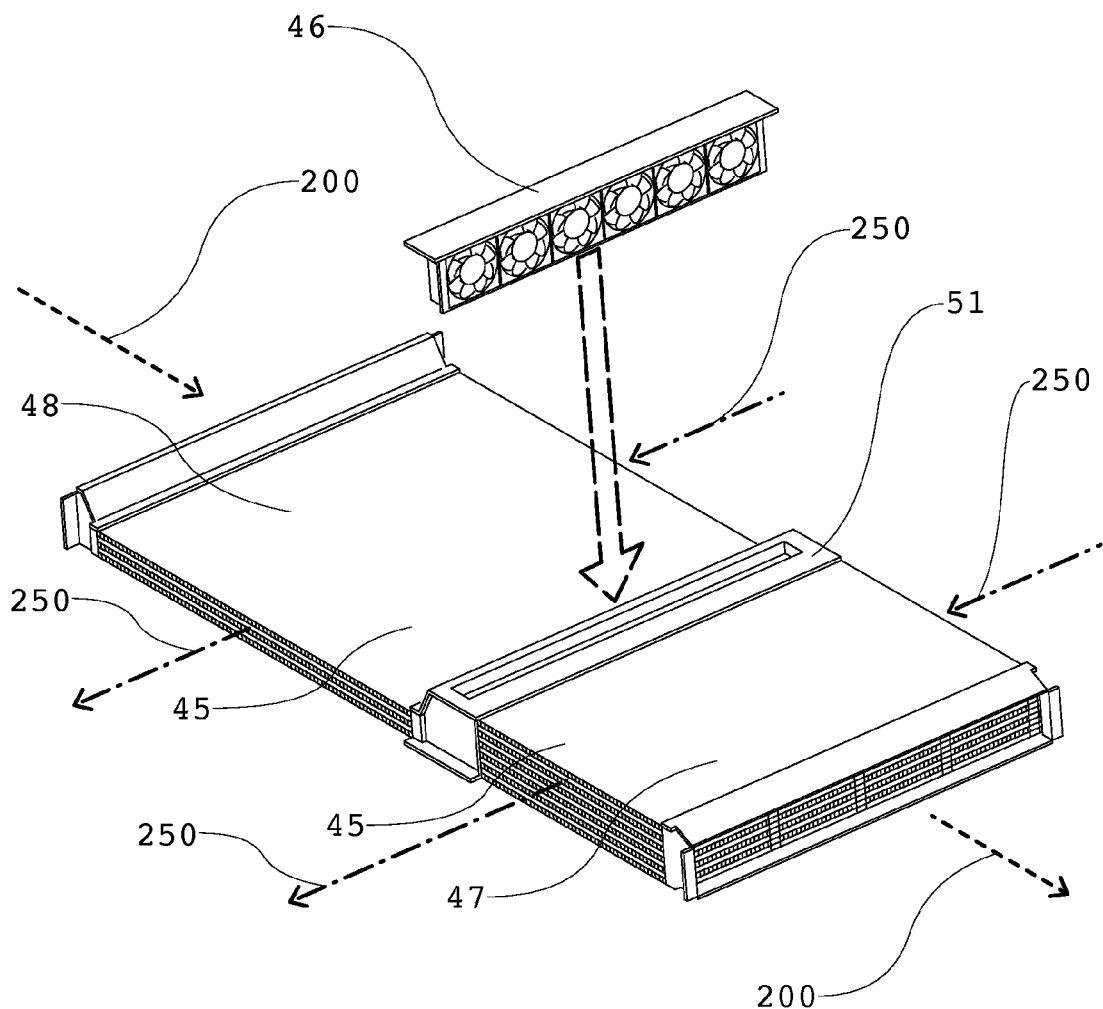
FIG. 7 provides an exploded perspective view of one exemplary embodiment of the heat exchanger and fan assembly.

FIG. 7 provides an exploded perspective view of one exemplary embodiment of the heat exchanger 45 and fan assembly 46. In this view, the fan assembly 46 is shown removed from its mounted position within the fan housing 51. In this embodiment, the heat exchanger 45 is divided into two portions 47 and 48 where the fan housing 51 is used to provide a gaseous communication between the two portions 47 and 48. Here, the fan assembly 46 is placed between the two portions 47 and 48. While the fan assembly 46 can be placed anywhere so that it draws ambient gas 200 through the heat exchanger 45, it has been found that placing the fan assembly 46 between the two portions of the heat exchanger can provide a number of benefits. First, the volumetric flow rate of the ambient gas 200 through the heat exchanger is high, which results in better cooling capabilities for the heat exchanger 45. Second, the noise produced by the fan assembly 46 can be reduced because the surrounding portions 47 and 48 of the heat exchanger 45 essentially act as a muffler for the fan assembly 46.

In this embodiment, portion 48 is thinner and longer than portion 47. This was done in order to free up more space within the housing so that additional electronic components could fit within the housing (adjacent to portion 48). As shown, the fan housing 51 may be used to connect two portions of a heat exchanger which may be of different lengths. As shown, portion 48 of the heat exchanger is thinner than the fan housing 51. In an alternative embodiment, both portions 48 and 47 may be thinner than the fan assembly 46 such that a fan housing 51 may be used to provide a sealed gaseous communication between the two portions, even though they are both thinner than the fan assembly 51. This design may be preferable when it is desirable to create the largest possible heat exchanger 45 (for maximum cooling abilities) even though space is limited. This is of course not required, and other embodiments may have portions which are of equal width and length. Also, although this embodiment uses the fan assembly 46 to drive the ambient gas 200, other embodiments could use a fan assembly placed within the heat exchanger to drive the circulating gas 250 instead and drive the ambient gas 200 with another fan assembly (possibly placed within the heat exchanger or located at the entrance/exit of the heat exchanger). Some exemplary embodiments may place fans within the heat exchanger 45 to drive both the ambient gas 200 and circulating gas 250.

The ambient gas 200 travels through a first pathway (or plurality of pathways) of the heat exchanger 45 while the circulating gas 250 travels through a second pathway (or plurality of pathways) of the heat exchanger 45. Although not required, it is preferable that the circulating gas 250 and ambient gas 200 do not mix. This may prevent any contaminates and/or particulate that is present within the ambient gas 200 from harming the interior of the display. In a preferred embodiment, the heat exchanger 45 would be a cross-flow heat exchanger. However, many types of heat exchangers are known and can be used with any of the embodiments herein. The heat exchanger 45 may be a cross-flow, parallel flow, or counter-flow heat exchanger. In an exemplary embodiment, the heat exchanger 45 would be comprised of a plurality of stacked layers of thin plates. The plates may have a corrugated, honeycomb, or tubular design, where a plurality of channels/pathways/tubes travel down the plate length-wise. The plates may be stacked such that the directions of the pathways are alternated with each adjacent plate, so that each plate's pathways are substantially perpendicular to the pathways of the adjacent plates. Thus, ambient gas or circulating gas may enter an exemplary heat exchanger only through plates whose channels or pathways travel parallel to the path of the gas. Because the plates are alternated, the circulating gas and ambient gas may travel in plates which are adjacent to one another and heat may be transferred between the two gases without mixing the gases themselves (if the heat exchanger is adequately sealed, which is preferable but not required).

In an alternative design for a heat exchanger, an open channel may be placed in between a pair of corrugated, honeycomb, or tubular plates. The open channel may travel in a direction which is perpendicular to the pathways of the adjacent plates. This open channel may be created by running two strips of material or tape (esp. very high bond (VHB) tape) between two opposite edges of the plates in a direction that is perpendicular to the direction of the pathways in the adjacent plates. Thus, gas entering the heat exchanger in a first direction may travel through the open channel (parallel to the strips or tape). Gas which is entering in a second direction (substantially perpendicular to the first direction) would travel through the pathways of the adjacent plates).

Other types of cross-flow heat exchangers could include a plurality of tubes which contain the first gas and travel perpendicular to the path of the second gas. As the second gas flows over the tubes containing the first gas, heat is exchanged between the two gases. Obviously, there are many types of cross-flow heat exchangers and any type would work with the embodiments herein.

An exemplary heat exchanger may have plates where the sidewalls have a relatively low thermal resistance so that heat can easily be exchanged between the two gases. A number of materials can be used to create the heat exchanger. Preferably, the material used should be corrosion resistant, rot resistant, light weight, and inexpensive. Metals are typically used for heat exchangers because of their high thermal conductivity and would work with these embodiments. However, it has been discovered that plastics and composites can also satisfy the thermal conditions for electronic displays. An exemplary embodiment would utilize polypropylene as the material for constructing the plates for the heat exchanger. It has been found that although polypropylene may seem like a poor thermal conductor, the large amount of surface area relative to a small sidewall thickness, results in an overall thermal resistance that is low. Thus, an exemplary heat exchanger would be made of plastic and would thus produce a display assembly that is thin and lightweight. Specifically, corrugated plastic may be used for each plate layer where they are stacked together in alternating fashion (i.e. each adjacent plate has channels which travel in a direction perpendicular to the surrounding plates).

Figure 8:
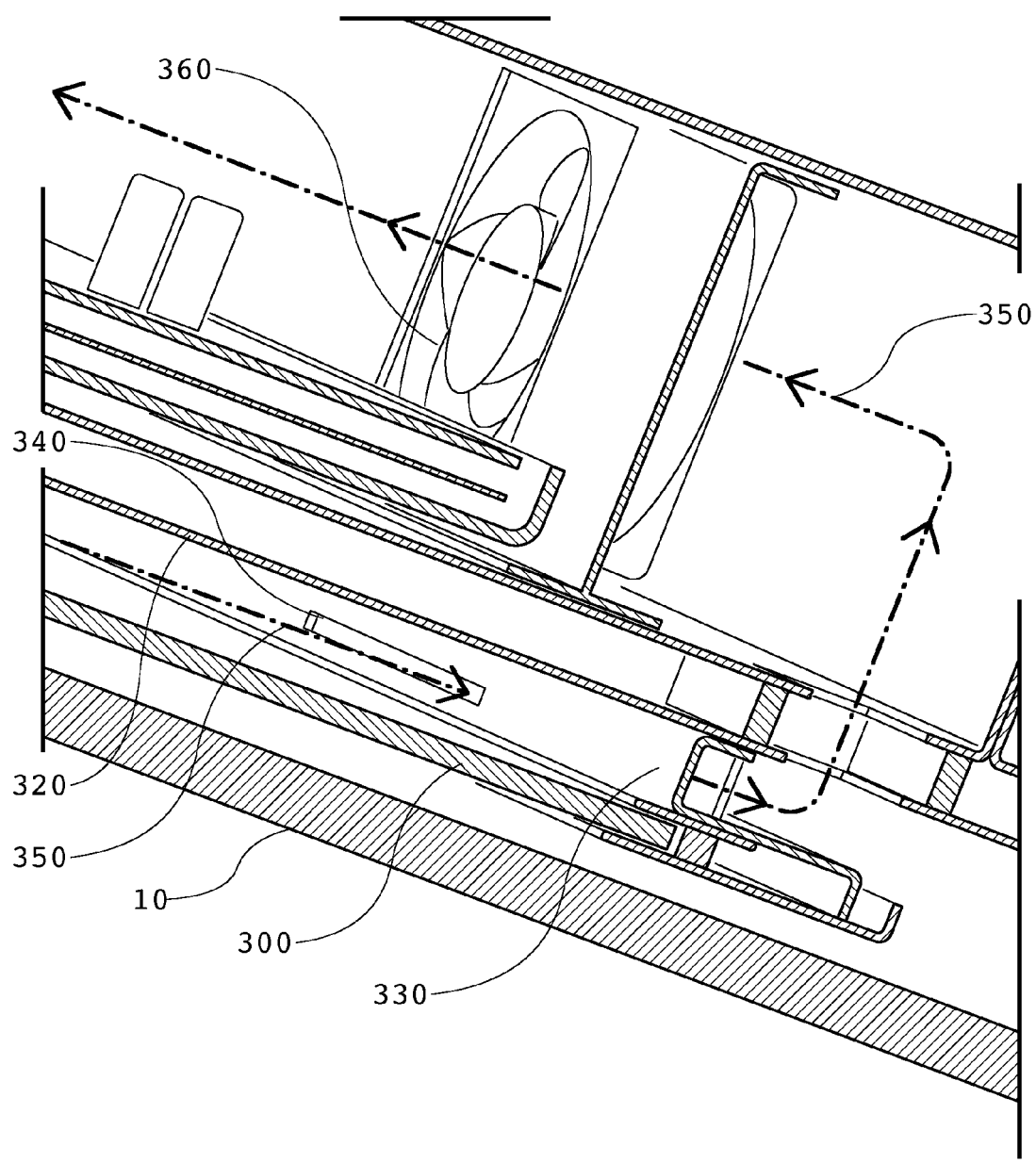
FIG. 8 provides a perspective sectional view of another embodiment which uses a flow of circulating gas through the backlight cavity of a liquid crystal display (LCD).

FIG. 8 provides a perspective sectional view of another embodiment which uses a flow of circulating gas 350 through the backlight cavity of a liquid crystal display (LCD) 300. In this embodiment, a LCD 300 and an associated backlight 320 are used as the electronic image assembly. A backlight wall 330 may enclose the area between the LCD 300 and the backlight 320 in order to create a backlight cavity. Typically, the backlight cavity is closed to prevent contaminates/particulate from entering the backlight cavity and disrupting the optical/electrical functions of the backlight 320. However, as discussed above the exemplary embodiments may use a clean gaseous matter for the circulating gases which could now be used to ventilate the backlight cavity in order to cool the backlight 320 and even the rear portion of the LCD 300. An opening 340 can be placed in the backlight wall 330 to allow circulating gas 350 to flow through the backlight cavity. A fan assembly 360 may be used to draw the circulating gas 350 through the backlight cavity. In an exemplary embodiment there would be an opening on the opposing backlight wall (on the opposite side of the display as shown in this figure) so that circulating gas 350 could easily flow through the backlight cavity. In this way, the backlight cavity is placed in gaseous communication with the heat exchanger 45.

Figure 9:
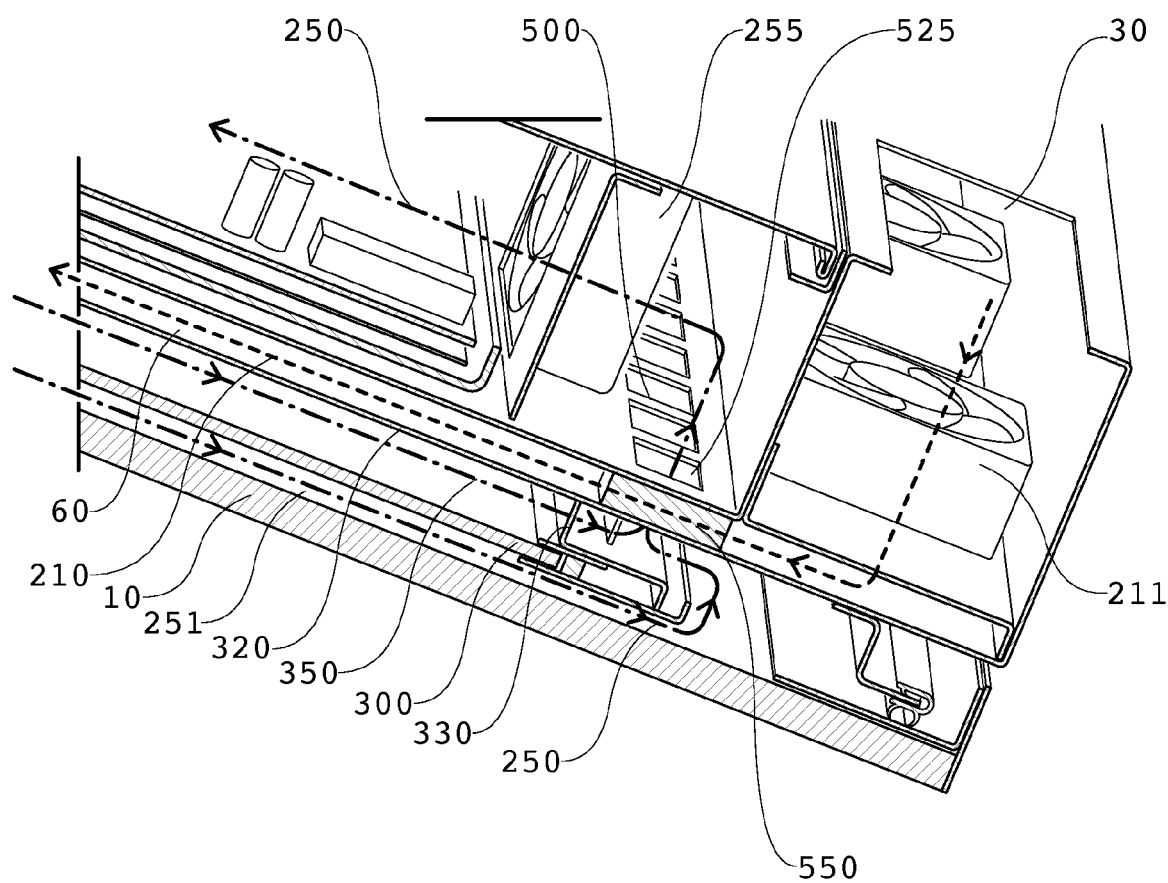
FIG. 9 provides a perspective sectional view of an exemplary embodiment which uses a flow of circulating gas through the backlight cavity in addition to the flow of circulating gas between the LCD and front plate.

FIG. 9 provides a perspective sectional view of an exemplary embodiment which uses a flow of circulating gas 350 through the backlight cavity in addition to the flow of circulating gas 250 through the front channel 251 (the area defined between the LCD 300 and front plate 10). Circulating fan assembly 255 may be placed so that it can draw circulating gas 350 through the backlight cavity as well as circulating gas 250 through the front channel 251. As discussed above, the circulating gases 250 and 350 are preferably forced through the heat exchanger 45 (not shown in this figure) so that they may be cooled by the ambient gas 200 (also not shown in this figure). In this way, both the front channel 251 and the backlight cavity are placed in gaseous communication with the heat exchanger 45.

Also shown in FIG. 9 is the optional additional flow of ambient gas 210 which may travel immediately behind the electronic image assembly (in this embodiment backlight 320). Once travelling through the first manifold 30, the ambient gas 210 may pass through the channels 60 in order to remove heat from the backlight 320 and even the channels 60 themselves (if they are thermally conductive). The manifold fan assembly 211 may be used to draw the ambient gas 210 into the first manifold 30 and through the channels 60. Again, the cross though plate 500 may be used to allow the circulating gases 350 and 250 to cross paths with the ambient gas 210 without letting the two gases mix.

In an exemplary embodiment, the backlight 320 would contain a plurality of LEDs mounted on a thermally conductive substrate (preferably a metal core PCB). On the surface of the thermally conductive substrate which faces the channels 60 there may be a thermally conductive plate which may be in thermal communication with the channels 60. In an exemplary embodiment, the thermally conductive plate would be metallic and more preferably aluminum and the thermal communication between the channels 60 and the backlight 320 would be conductive thermal communication.

As noted above, many electronic image assemblies (especially LEDs, LCDs, and OLEDs) may have performance properties which vary depending on temperature. When 'hot spots' are present within an image assembly, these hot spots can result in irregularities in the resulting image which might be visible to the end user. Thus, with the embodiments described herein, the heat which may be generated by the image assembly (sometimes containing a backlight assembly) can be distributed (somewhat evenly) throughout the channels 60 and thermally-conductive surfaces to remove hot spots and cool the backlight and/or electronic image assembly.

The circulating gases 250 and 350, ambient gas 200, and optional ambient gas 210 can be any number of gaseous matters. In some embodiments, air may be used as the gas for all. As well known by those of ordinary skill in the art, air typically contains some amount of water vapor. It should be noted that the use of the term 'gas' herein does not designate pure gas and that it is specifically contemplated that any of the gaseous matters described herein may contain some amount of impurities including but not limited to water vapor. Preferably, because the circulating gases 250 and 350 may travel in front of the image assembly and backlight respectively, they should be substantially clear, so that they will not affect the appearance of the image to a viewer. The circulating gases 250 and 350 should also preferably be substantially free of contaminates and/or particulate in order to prevent an adverse effect on the image quality and/or damage to the internal electronic components. It may sometimes be preferable to keep ambient gases 200 and 210 from having contaminates as well. Filters may be used to help reduce the particulate within ambient gases 200 and 210. Filters could be placed near the inlet aperture 24 so that ambient gases 200 and/or 210 could be drawn through the filter. However, in an exemplary embodiment the display may be designed so that contaminates could be present within the ambient gases 200 and 210 but this will not harm the display. In these embodiments, the heat exchanger 45, manifolds 30 and 35, channels 60, and any other pathway for ambient or circulating gas should be properly sealed so that any contaminates in the ambient gas would not enter sensitive portions of the display. Thus, in these exemplary embodiments, ambient air may be ingested for the ambient gases 200 and 210, even if the ambient air contains contaminates or particulate. This can be particularly beneficial when the display is used in outdoor environments or indoor environments where contaminates are present in the ambient air.

The cooling system may run continuously. However, if desired, temperature sensing devices (not shown) may be incorporated within the electronic display to detect when temperatures have reached a predetermined threshold value. In such a case, the various cooling fans may be selectively engaged when the temperature in the display reaches a predetermined value. Predetermined thresholds may be selected and the system may be configured to advantageously keep the display within an acceptable temperature range. Typical thermostat assemblies can be used to accomplish this task. Thermocouples may be used as the temperature sensing devices.

It is to be understood that the spirit and scope of the disclosed embodiments provides for the cooling of many types of electronic image assemblies. As used herein, the term 'electronic image assembly' is any electronic assembly for creating an image. At this time this, these are LCD (all types), light emitting diode (LED), organic light emitting diode (OLED), field emitting display (FED), light emitting polymer (LEP), organic electro luminescence (OEL), plasma displays, and any thin/flat panel electronic image assembly. Furthermore, embodiments may be used with displays of other types including those not yet discovered. In particular, it is contemplated that the system may be well suited for use with full color, flat panel OLED displays. Exemplary embodiments may also utilize large (55 inches or more) LED backlit, high definition liquid crystal displays (LCD). While the embodiments described herein are well suited for outdoor environments, they may also be appropriate for indoor applications (e.g., factory/industrial environments, spas, locker rooms) where thermal stability of the display may be a concern.

As is well known in the art, electronic displays can be oriented in a portrait manner or landscape manner and either can be used with the embodiments herein.

Having shown and described preferred embodiments, those skilled in the art will realize that many variations and modifications may be made to affect the described embodiments and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

The invention claimed is:

1. An assembly for cooling an electronic image assembly placed within a housing, the assembly comprising:
   an ambient gas pathway positioned within the housing;
   a circulating gas pathway positioned within the housing;
   a heat exchanger placed within the ambient gas and circulating gas pathways; and
   an ambient gas fan positioned within the heat exchanger to force ambient gas through the heat exchanger.

2. The cooling assembly of claim 1 further comprising:
   a circulating gas fan positioned to force circulating gas through the heat exchanger.

3. The cooling assembly of claim 1 further comprising:
   a pass through plate positioned at an intersection of the ambient gas and circulating gas pathways.

4. The cooling assembly of claim 1 further comprising:
   an electronic component placed within the path of the circulating gas.

5. The cooling assembly of claim 4 wherein:
   the electronic component is a power module.

6. The cooling assembly of claim 1 wherein:
   the heat exchanger portions are comprised of corrugated plastic.

7. The cooling assembly of claim 1 wherein:
   the heat exchanger portions are cross-flow heat exchanger portions.

8. An assembly for cooling an electronic image assembly within a housing, the assembly comprising:
   an ambient gas pathway;
   a circulating gas pathway encircling the electronic image assembly;
   a first portion of a heat exchanger placed within the ambient gas pathway;
   a second portion of a heat exchanger placed within the ambient gas pathway; and
   an ambient gas fan positioned between the first and second portions of the heat exchanger.

9. The cooling assembly of claim 8 wherein:
   the first or second portion of the heat exchanger is in gaseous communication with the circulating gas pathway.

10. The cooling assembly of claim 8 wherein:
    the circulating gas pathway comprises a front channel defined by the space between the electronic image assembly and a transparent front plate.

11. The cooling assembly of claim 8 wherein:
    the ambient gas and circulating gas are not permitted to mix.

12. The cooling assembly of claim 8 further comprising:
    an electronic component placed within the path of the circulating gas.

13. The cooling assembly of claim 8 further comprising:
    a circulating gas fan positioned to force circulating gas through the first or second portion of the heat exchanger.

14. The cooling assembly of claim 8 further comprising:
    a pass through plate positioned at an intersection of the ambient gas and circulating gas pathways.

15. The cooling assembly of claim 8 wherein:
    the heat exchanger is a cross-flow heat exchanger.

16. An electronic display assembly comprising:
    a housing having an inlet aperture and exit aperture for ambient gas;
    an electronic image assembly within the housing;

a transparent front plate in front of the electronic image assembly, the space between the transparent front plate and the electronic image assembly defining a channel;

an ambient gas pathway connecting between the inlet aperture and exit aperture;

a heat exchanger in gaseous communication with the ambient gas pathway, the heat exchanger comprising two portions;

a first fan placed between the two portions of the heat exchanger to force ambient gas through the heat exchanger; and a second fan positioned to force circulating gas through the channel and at least one portion of the heat exchanger.

17. The electronic display assembly of claim 16 further comprising:

a power module placed within the path of the circulating gas.

18. The electronic display assembly of claim 16 further comprising:

a pass through plate positioned at an intersection of the ambient gas and circulating gas pathways.

19. The electronic display assembly of claim 16 wherein:
the electronic image assembly is an OLED display.

20. The electronic display assembly of claim 16 wherein:
the heat exchanger is a cross-flow heat exchanger comprised of corrugated plastic layers.

* * * * *